(12) United States Patent
Muendel et al.

(10) Patent No.: US 9,391,425 B2
(45) Date of Patent: Jul. 12, 2016

(54) WAVELENGTH COMBINED LASER SYSTEM

(71) Applicant: Lumentum Operations LLC, Milpitas, CA (US)

(72) Inventors: Martin H. Muendel, Oakland, CA (US); Xiuquan Ma, Freemont, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 14/884,440

(22) Filed: Oct. 15, 2015

(65) Prior Publication Data

US 2016/0111850 A1    Apr. 21, 2016

Related U.S. Application Data

(60) Provisional application No. 62/065,350, filed on Oct. 17, 2014.

(51) Int. Cl.
| | |
|---|---|
| *H01S 3/10* | (2006.01) |
| *H01S 3/23* | (2006.01) |
| *H01S 3/08* | (2006.01) |
| *H01S 3/081* | (2006.01) |

(52) U.S. Cl.
CPC ............ *H01S 3/2391* (2013.01); *H01S 3/0811* (2013.01); *H01S 3/08036* (2013.01)

(58) Field of Classification Search
CPC ........................................................ H01S 3/10
USPC ................................. 372/9; 385/24; 359/615
See application file for complete search history.

(56) References Cited

U.S. PATENT DOCUMENTS

| | | |
|---|---|---|
| 6,192,062 B1 | 2/2001 | Sanchez-Rubio et al. |
| 6,665,471 B1 | 12/2003 | Farmer et al. |
| 2003/0095736 A1* | 5/2003 | Kish, Jr. ................. B82Y 20/00 385/14 |
| 2008/0205459 A1 | 8/2008 | Yonekubo |
| 2012/0250706 A1 | 10/2012 | Stiens et al. |
| 2013/0208361 A1* | 8/2013 | Chann ................ G02B 19/0057 359/615 |

OTHER PUBLICATIONS

Goyal et al., "Wavelength Beam Combining of Mid-IR Semiconductor Lasers," LEOS 2001, The 14$^{th}$ Annual Meeting of the IEEE of Lasers and Electro-Optics Society, vol. 2, Nov. 14, 2001, 2 pages.
Extended European Search Report corresponding to EP Application No. 15 19 0166, mailed Mar. 14, 2016, 10 pages.

* cited by examiner

*Primary Examiner* — Tuan Nguyen
(74) *Attorney, Agent, or Firm* — Harrity & Harrity, LLP

(57) ABSTRACT

A beam combiner may include source elements, each configured to output a beam of light locked at a center wavelength different from center wavelengths of other source elements. The beam combiner may include a dispersive element configured to combine the beams of light into a combined beam, and a beam separator configured to separate the combined beam into an output beam and a locking beam. The beam combiner may include a spatial filter configured to prevent crosstalk within the locking beam, and to redirect the locking beam to the source elements. The dispersive element may be configured to disperse the locking beam into constituent wavelength beams. Each constituent wavelength beam may be directed to a respective one of the source elements for locking that source element at its center wavelength, and may correspond in wavelength to the center wavelength of the respective source element.

20 Claims, 5 Drawing Sheets

US 9,391,425 B2

WAVELENGTH COMBINED LASER SYSTEM

RELATED APPLICATION

This application claims priority under 35 U.S.C. §119 to U.S. Provisional Patent Application No. 62/065,350, filed on Oct. 17, 2014, the content of which is incorporated by reference herein in its entirety.

TECHNICAL FIELD

The present disclosure relates to laser systems and methods of operating laser systems. More particularly, the present disclosure relates to methods and systems for wavelength-locking and beam-combining beams launched by a set of laser diodes.

BACKGROUND

Laser systems may incorporate collections of two or more laser diodes either as the direct source of the output laser radiation, or as a pump for a diode-pumped laser, such as a fiber laser, a disk laser, a slab laser, a rod laser, a diode-pumped solid-state laser, a Raman laser, a Brillouin laser, an optical parametric laser, an alkali-vapor laser, or the like. In some laser applications, such as an industrial materials processing application (e.g., sheet metal cutting and welding), beams of light (herein referred to as beams), provided by the two or more laser diodes may be combined to generate, for example, a single high-power and/or high-quality output beam.

SUMMARY

A beam combiner may comprise: an array of source elements, where each source element, of the array of source elements, may be configured to output a beam of light locked at a center wavelength different from center wavelengths of other source elements of the array of source elements; a dispersive element configured to combine the beams of light into a combined beam; a beam separator configured to separate the combined beam into an output beam and a locking beam, where the locking beam may comprise a smaller portion of the combined beam than the output beam, and where the smaller portion may include a portion of the beam of light of each source element; a spatial filter configured to prevent crosstalk within the locking beam, and to redirect the locking beam back to the array of source elements; and the dispersive element configured to disperse the locking beam into constituent wavelength beams, where each constituent wavelength beam may be directed to a respective one of the array of source elements for locking that source element at its center wavelength, and where each constituent wavelength beam may correspond in wavelength to the center wavelength of the respective source element.

A beam combiner may comprise a beam separator configured to separate a combined beam into an output beam and a locking beam, where the combined beam may be a beam of light that is a combination of beams of light provided by source elements of a source array, where each source element, of the source array, may be configured to output a beam of light locked at a center wavelength different from center wavelengths of other source elements of the source array, and where the locking beam may include a portion of the combined beam that is smaller than the output beam, where the smaller portion may include a portion of the beam of light of each source element; a locking arm configured to prevent crosstalk within the locking beam, and to redirect the locking beam back to the source array; and a dispersive element configured to disperse the locking beam into a group of wavelength beams, where each wavelength beam may be directed to a respective one of the source elements, of the source array, for locking that source element at its center wavelength, and where each wavelength beam may correspond in wavelength to the center wavelength of the respective source element.

A method may comprise separating, by a beam combiner, a combined beam into an output beam and a locking beam, where the combined beam may be a beam of light that is a combination of beams of light provided by source elements included in a source array, where each source element, of the source array, may be configured to output a beam of light locked at a center wavelength different from center wavelengths of other source elements of the source array, and where the locking beam may include a portion of the combined beam that is smaller than the output beam, where the smaller portion may include a portion of the beam of light of each source element; preventing, by the beam combiner, crosstalk within the locking beam; redirecting, by the beam combiner, the locking beam back to the source array; and dispersing, by the beam combiner, the locking beam into a set of wavelength beams, where each wavelength beam may be directed to a respective one of the source elements of the source array for locking that source element at its center wavelength, and where each wavelength beam may correspond in wavelength to the center wavelength of the respective source element.

DETAILED DESCRIPTION

Figure 1:
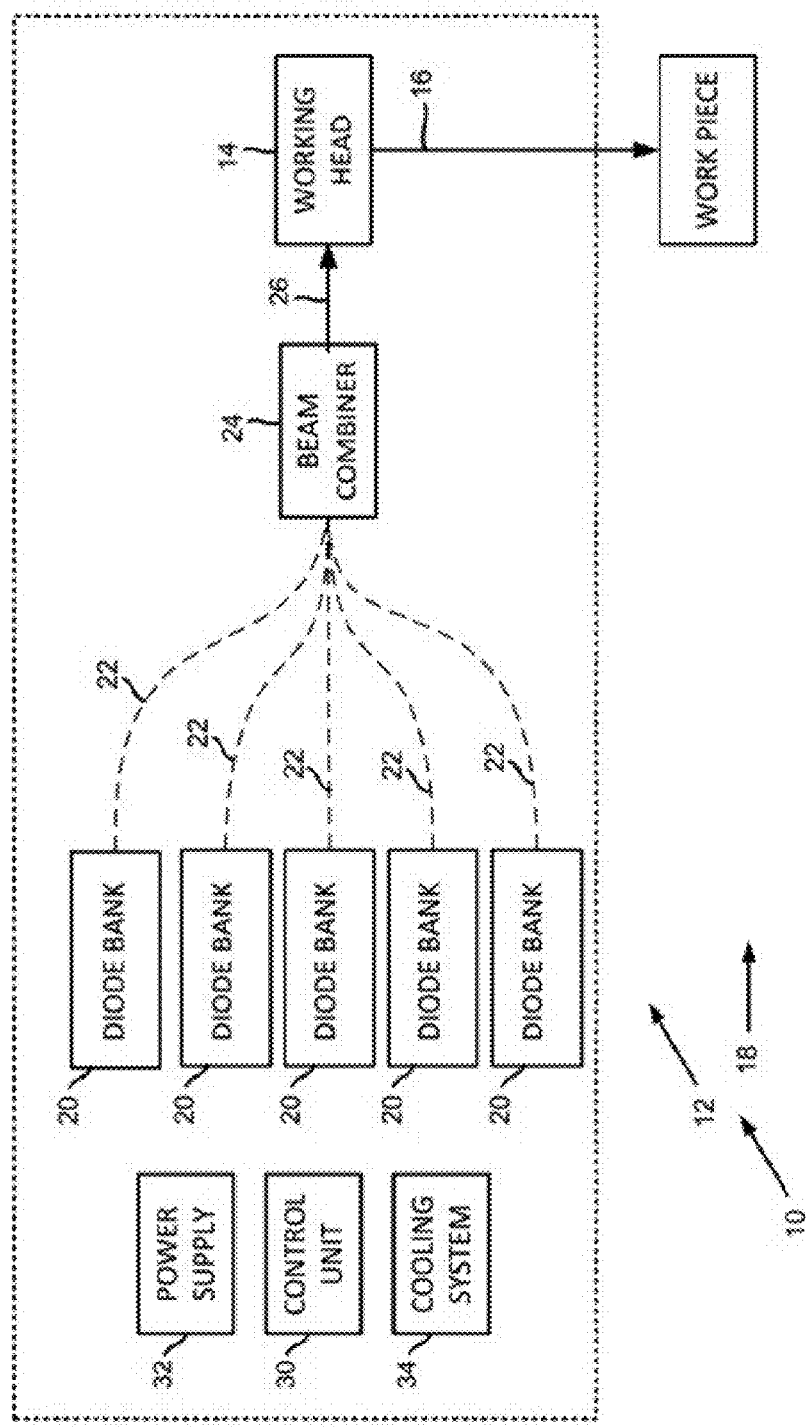
FIG. 1 is a diagram depicting example components of a laser machining apparatus comprising a laser system.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

A laser system may include a beam combiner configured to perform wavelength beam combining. For example, the beam combiner may be configured to combine beams launched by of a group of laser sources (e.g., a group of laser diodes, a laser array, etc.) in order to generate a single output beam. The use of a scalable beam-combining technology may allow for a power-scalable laser source (e.g., even when the individual laser sources are not scalable).

However, traditional methods of wavelength beam combining may be susceptible to crosstalk between laser sources, which leads laser sources to wavelength-lock at an incorrect wavelength, causing the beams not to combine into a single beam. In some cases, use of a spatial filter may help mitigate crosstalk, but the spatial filter may introduce loss on the output beam when the output beam passes through the spatial filter.

A beam combiner may operate such that an array of source elements (e.g., gain elements), each with a substantial gain bandwidth, is coupled through a lens onto a dispersive element, such as a grating, and then through a partial reflector that sends a fraction (e.g., 1% to 10%) of the beam (i.e., a feedback signal, a locking beam, etc.) back to the source elements in order to cause the source elements to wavelength-lock at appropriate wavelengths such that the beams, provided by the source elements, may be combined into a single output beam from the grating onward.

The feedback signal that each source element receives from the partial reflector should have originated from that particular source element. However, if a source element receives a feedback signal that originated from a different source element, then the pair of source elements will both lase at an intermediate wavelength between those at which the pair of source elements would lase in the absence of crosstalk, and the beams after the grating may not be collinear with each other or with those of the other source elements. Thus, it would be beneficial that the optical design suppress crosstalk among the source elements (i.e. any feedback paths other than those of each source element back to itself).

In the absence of additional optical elements, a given optical design may provide insubstantial suppression of crosstalk. For example, vignetting or misalignment of the crosstalk signal may occur if the partial reflector is located a distance of at least a substantial fraction of a Rayleigh range from the grating, which may cause the crosstalk paths to suffer more loss than the self-locking paths. As such, each source element may lase on the corresponding self-locking path. However, this technique may not substantially suppress crosstalk.

Additionally, or alternatively, in some cases, cross-coupling mitigation optics may be used between the grating and the partial reflector. The cross-coupling mitigation optics may re-size the beam to shorten the Rayleigh range, thus reducing the total optical length and physical size needed to provide sufficient discrimination against crosstalk. However, because this method does not completely suppress the crosstalk signal, the source elements may unexpectedly lock on a crosstalk signal under certain circumstances, and the beam combination system may fail and/or damage the laser system.

Suppression of crosstalk may be better provided when a spatial filter is inserted into the system proximal to the partial reflector. In some cases, the spatial filter may include a focusing lens and a small aperture that ensures that the only signals allowed to propagate are those signals that will strike the partial reflector at normal incidence, thus blocking any potential crosstalk paths and allowing only self-locking paths. However, in such a case, the entire combined beam (e.g., including both the portion destined to be reflected by the partial reflector for locking the source elements and the portion to be used as output) must traverse the spatial filter. This may result in a significant impact on system power and efficiency, as spatial filters may result in transmission loss on the order of 5 to 10% due to both transmission losses in lenses and clipping losses by the aperture. Moreover, since the beam through the aperture may be tightly focused, the high power density may erode and/or damage the aperture when operating at kilowatt power levels. Thus, there is a need for a method to prevent or reduce crosstalk among gain channels without adding loss to the output beam.

Implementations described herein may provide a beam combiner capable of reducing or preventing crosstalk by spatially separating a combined beam (e.g., exiting a grating) into a locking beam that is spatially filtered and fed back for wavelength locking without crosstalk, and an output beam that is used for output.

Figure 2:
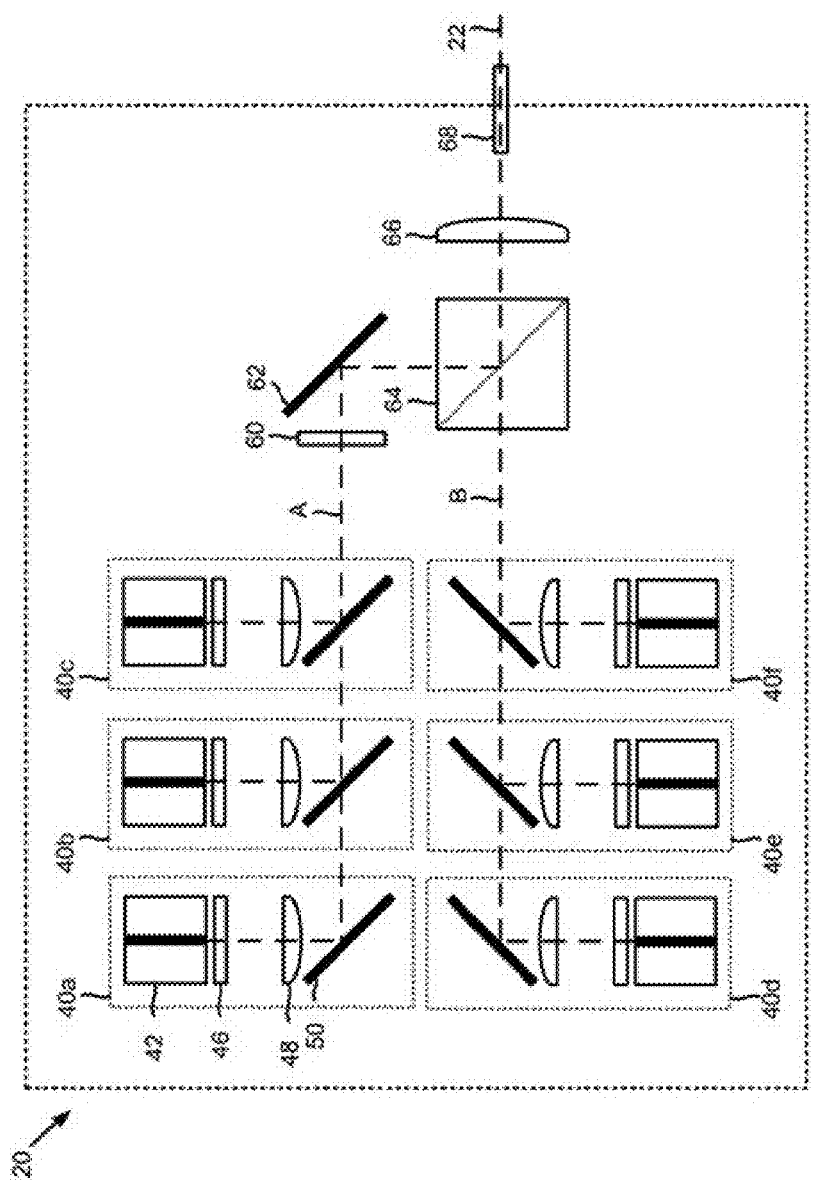
FIG. 2 is a diagram depicting example components of a diode bank of the laser system of FIG. 1.

FIG. 1 is a diagram depicting example components of a laser machining apparatus comprising a laser machining system 10 suitable for industrial materials processing applications and may incorporate embodiments of laser systems set forth herein and according with the implementations described herein. Laser machining system 10 comprises a laser system 12 having a working head 14 delivering a laser beam 16 to machine a work piece 18. Working head 14 is mounted on an X-Y carriage (not shown) programmed to orient laser beam 16 on a desired pattern, such as a cutting or engraving pattern. Laser system 12 comprises a plurality of diode banks 20, each of the diode banks 20 providing a laser beam 22 to a beam combiner 24. FIG. 2 depicts an example diode bank 20. Beam combiner 24 combines the beams in any manner known in the art or future developed, and outputs a combined beam 26 to working head 14. Example implementations of beam combiner 24 according with the implementations, described herein, are described below with reference to FIGS. 3A-3C.

Each laser beam 22 has an output power which is regulated by a control unit 30. In one example, control unit 30 regulates power supplied by a power supply 32 into a plurality of current flows to the plurality of diode banks 20, each current flow being individually controlled by control unit 30 to cause a diode bank 20 to produce a desired output power via a laser beam 22. A cooling system 34 may be provided to circulate a cooling liquid through diode banks 20 to maintain their temperatures within desired ranges.

One specific example of a laser system suitable for industrial materials processing applications according with the implementations, described herein, comprises multi-mode edge emitters on single-emitter chips, each producing up to about 10 Watts (W) of output power. In the present example, fourteen such single emitters are mounted in each package, wired in series, with an output of about 140 W coupled into a single output fiber. Each bank comprises three diode packages, or modules, wired in series. With a typical diode drop of about 1.8V per diode, each package has a total drop of about 25 V, and thus each bank operates at about 75 V. Five individually controllable banks wired in parallel may be used in the system, providing fifteen 140 W packages in total for a total available laser diode power of 2.1 kW. The fifteen output fibers (three per bank) or five output fibers (one per bank) may be coupled into one larger power delivery fiber leading to work piece 18, or into a pump input port of a fiber laser.

Example laser diodes suitable for use in the embodiments disclosed herein include any of various combinations of diode types and package types, such as edge emitters or vertical cavity surface-emitting lasers (VCSELs), single-transverse-mode or multi-mode lasers. Diode chips may include one emitter per semiconductor chip (single-emitter chips), or multiple emitters per chip (e.g. diode bars, VCSEL arrays). The chips may be packaged with one or multiple single-emitter chips inside one package or one or multiple multi-emitter chips inside one package. The laser output from the diode package, or bank, may be delivered in an optical fiber or as a free-space beam.

To generate the laser output of the diode bank, the chip outputs are combined within the diode bank. Light emitted from a high power single emitter is typically highly asymmetric resulting in long and thin emitting apertures. The light beam emitted by such lasers has much higher brightness in its "fast axis" (perpendicular to the main p/n junctions) than in its "slow axis" (parallel to the active layer). An optical fiber, generally, has a substantially circular or polygonal cross-section and a substantially symmetrical acceptance angle. To obtain the highest brightness, light beams from multiple single emitter diode lasers are coupled into a single fiber stacked in their fast axis direction. For example, an array of 3-10 individual laser emitters with a 100 micrometers (um) aperture width in the slow axis can be coupled into a fiber with a 105 um diameter and 0.15 NA (numerical aperture) by stacking individual laser beams in the fast axis direction.

Since the laser diode emission is typically polarized, polarization beam combining may be used to couple light emitted by two arrays of single emitters into a single fiber, thereby doubling the power and brightness of the output beam. One example of such laser beam combining incorporates both the spatial stacking of equally polarized laser beams with polarization multiplexing of stacked beams from two laser arrays. In one example, two rows of laser diodes are positioned on an upper level, and two rows of collimating lenses are positioned on a middle level. The light beams are collimated by the lenses and then reflected by two rows of vertically offset prism mirrors positioned on a lower level, to form two vertically stacked beams that are polarization combined using a polarization beam combiner (PBC) and a half wave plate.

In another example, first and second rows of laser diodes are disposed in a staggered arrangement with a lateral offset therebetween. The present example is described in additional detail in U.S. Pat. No. 8,427,749, issued Apr. 23, 2013, which is incorporated herein by reference in its entirety and further described with reference to diode bank 20 in FIG. 2.

The number and arrangement of components shown in FIG. 1 are provided as an example. In practice, laser system 10 may include additional components, fewer components, different components, or differently arranged components than those shown in FIG. 1. Additionally, or alternatively, a set of components (e.g., one or more components) of laser system 10 may perform one or more functions described as being performed by another set of components of laser system 10.

FIG. 2 is a diagram depicting example components of a diode bank 20 of laser system 10 of FIG. 1. As shown in FIG. 2, an example diode bank 20 comprises a plurality of diode laser subsystems 40a-40f, each comprising a diode laser 42, a fast axis collimator 46, a slow axis collimator 48, and a turning reflector 50. Diode laser subsystems 40a-40c generate parallel beams aligned vertically on a common plane A and vertically staggered such that a beam from one subsystem does not traverse the optical components of the other subsystems aligned on the common plane. Diode laser subsystems 40d-40f are similarly arranged and aligned on a common vertical plane B. Diode bank 20 further comprises optic elements arranged to combine the laser beams from the subsystems into laser beam 22 delivered by an output fiber 68. Example optic elements comprise a polarization converter 60, a folding mirror 62, a polarization beam combiner 64, and coupling optics 66.

The number and arrangement of components shown in FIG. 2 are provided as an example. In practice, diode bank 20 may include additional components, fewer components, different components, or differently arranged components than those shown in FIG. 2. Additionally, or alternatively, a set of components (e.g., one or more components) of diode bank 20 may perform one or more functions described as being performed by another set of components of diode bank 20.

Figure 3A:
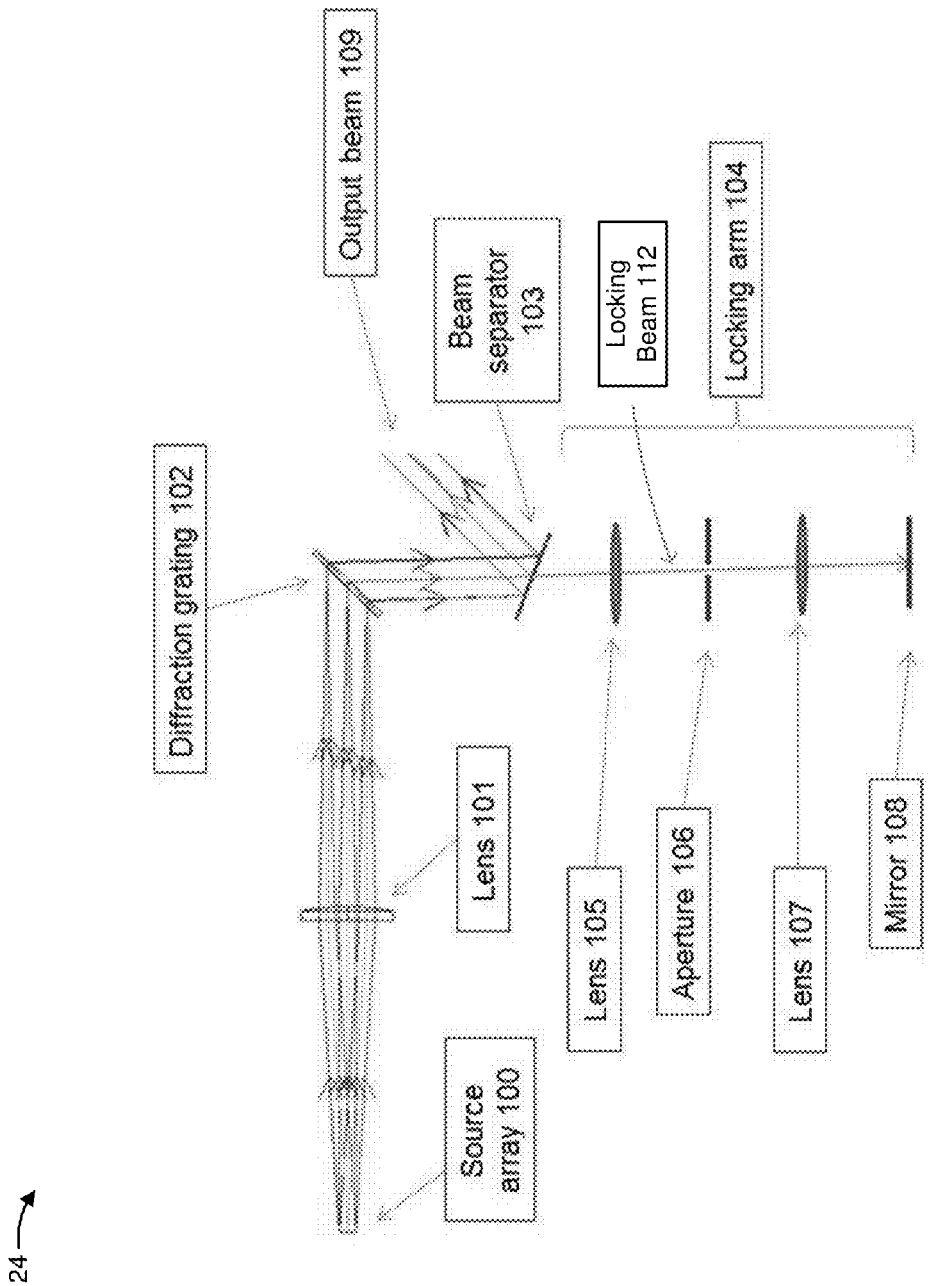
FIGS. 3A-3C are diagrams depicting example components of various implementations of a beam combiner of FIG. 2.
Figure 3B:
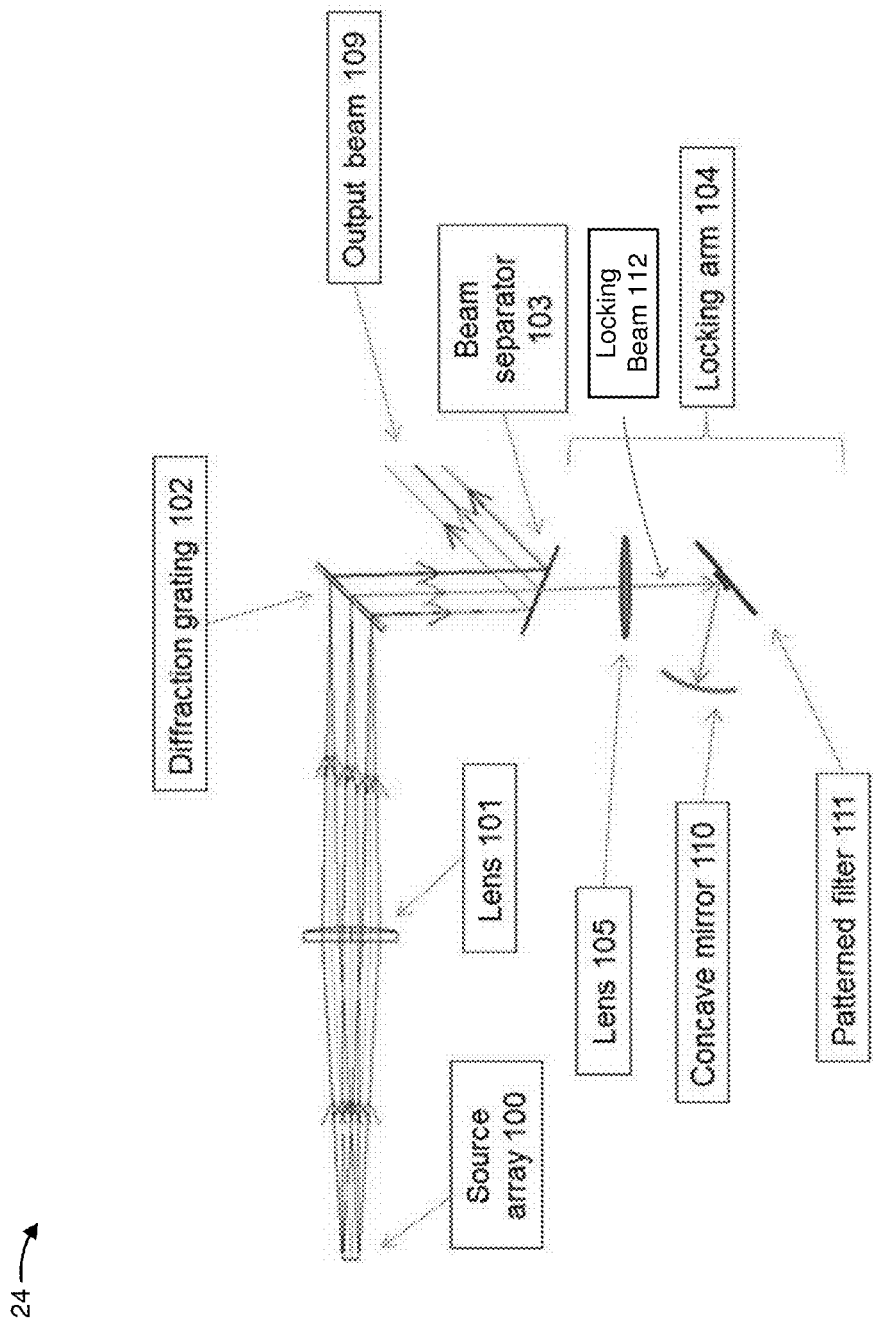
Figure 3C:
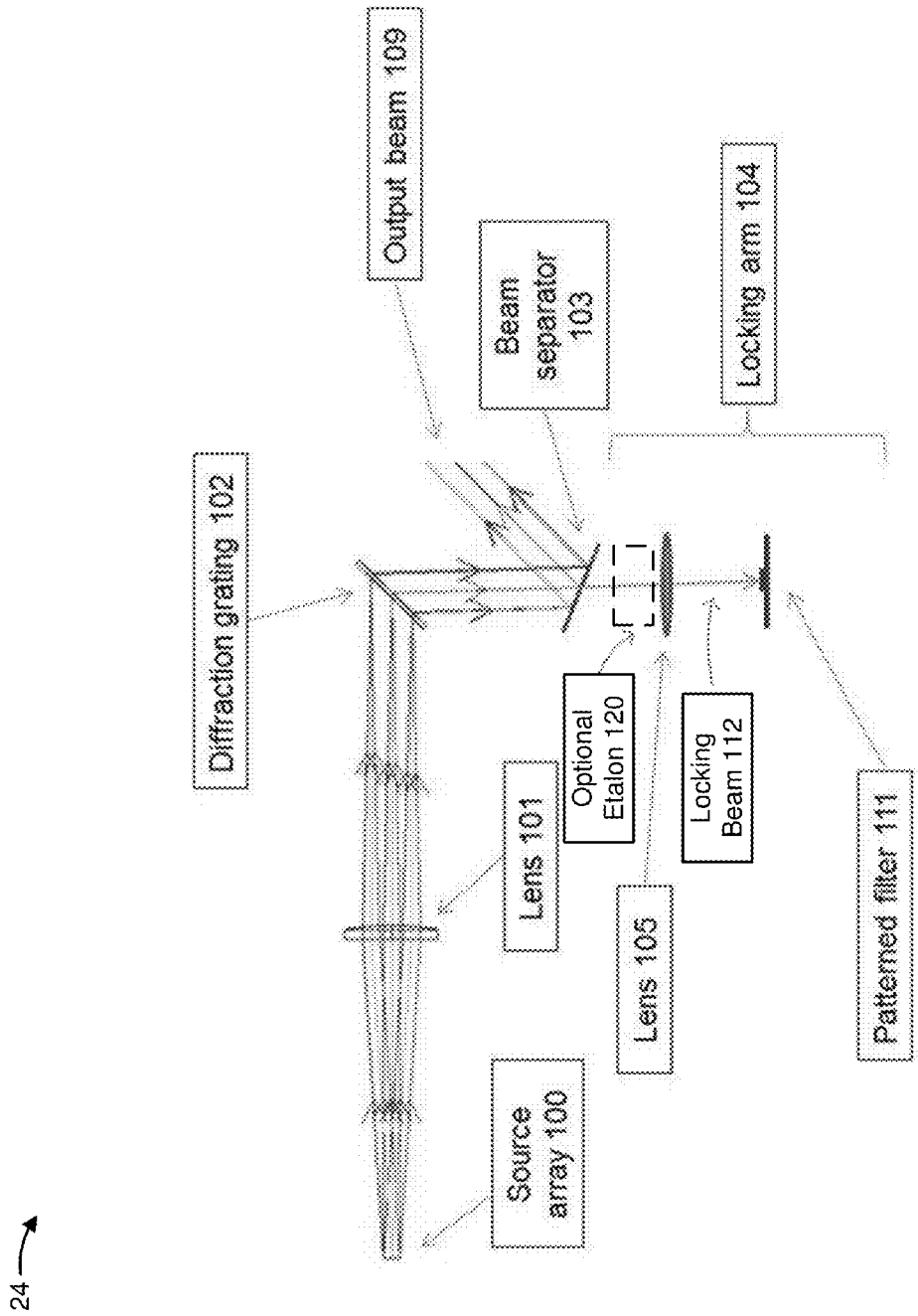

FIGS. 3A-3C are diagrams depicting example components of various implementations of beam combiner 24 of FIG. 1. FIG. 3A depicts example components of a first implementation of beam combiner 24.

As shown in FIG. 3A, beam combiner 24 may include a source array 100 that includes a group of source elements, which can comprise gain elements such as diode banks 20 including laser diodes, or non-gain elements such as output facets of passive fibers that are coupled to laser gain media.

Each source element in source array 100 may provide (e.g., launch, output, etc.) a beam of light, each beam having a different wavelength band and center wavelength. In some implementations, source array 100 may be positioned approximately in a focal plane of a collimating lens 101.

A dispersive element (e.g., diffraction grating 102) may be positioned in a collimated beam following lens 101 (e.g., approximately in another focal plane of lens 101). Diffraction grating 102 may be capable of combining the beams of light provided by source array 100. In some implementations, a concave mirror may be used in place of lens 101. Additionally, or alternatively, a curved and chirped grating may be used in place of both lens 101 and diffraction grating 102. In some implementations, diffraction grating 102 may be capable of dispersing reflected locking beam 112 into a group of constituent wavelength beams, where each constituent wavelength beam may correspond to a particular source element of source array 100.

As further shown in FIG. 3A, beam combiner 24 may include beam separator 103 capable of separating the beam exiting diffraction grating 102 into output beam 109 and locking beam 112. As shown, locking beam 112 may traverse a locking arm 104 that includes a spatial filter. As shown, the spatial filter may be in a reflective configuration and may be comprised of lens 105, aperture 106 (e.g., positioned substantially coincident with a focal plane of lens 105), a lens 107 (e.g., positioned such that a focal plan of lens 107 substantially coincides with aperture 106), and mirror 108. In some implementations, mirror 108 may be partially reflective (e.g., less than 99% reflective) or highly reflective (e.g., greater than 99% reflective). In some implementations, lens 105, aperture 106, and/or lens 107 may ensure that only normal (e.g., 90 degrees) or near-normal incidence light strikes mirror 108, thus preventing crosstalk among source elements of source array 100.

In some implementations, beam separator 103 may comprise at least one portion that is highly reflective and at least one portion that is highly transmissive (e.g., greater than 99% transmissive, greater than 95% transmissive, etc.). In some implementations, beam separator 103 may be configured such that output beam 109 is reflected and locking beam 112 is transmitted. Alternatively, beam separator 103 may be configured such that output beam 109 is transmitted and locking beam 112 is reflected.

In some implementations, locking beam 112 may include between 1% and 20% of a total power from diffraction grating 102 incident on the beam separator 103, so the relative areas of the reflective and transmissive regions of beam separator 103 and aperture 106 should be chosen accordingly. In some implementations, locking beam 112 may be selected from the middle of the incident beam (e.g., as shown in FIG. 3A), or from another portion of the incident beam, such as the periphery of the incident beam. Additionally, or alternatively, locking beam 112 may include a stripe through the incident beam. In one example implementation, beam separator 103 may include a scraper mirror, which may include a highly reflective mirror with a hole that allows a portion of the incident beam to be transmitted through beam separator 103. In another example implementation, beam separator 103 may include a patterned thin-film filter with at least one highly reflective portion and at least one antireflective portion (e.g., less than 1% reflective).

In some implementations, aperture 106 may include an absorptive, scattering, and/or reflective substrate that includes a hole or a slit. Additionally, or alternatively, aperture 106 may be implemented as a patterned thin-film filter with highly transmissive and highly reflective portions. In some implementations, since the dispersion of the diffraction grating 102 may be in one plane, either a dot or a vertical slit (e.g., perpendicular to the plane of dispersion) may provide prevention of crosstalk. In a case where a reflective substrate or filter is used, aperture 106 may be angled (e.g., out of the plane), such that reflected (i.e., rejected) light is discarded and not coupled back into the system.

In some implementations, in order to achieve efficient transmission of locking beam 112 back to source array 100, locking arm 104 may be designed to image the plane of beam separator 103 back to itself upon transmission through the spatial filter (and off mirror 108). This may ensure that locking beam 112 fits back through beam separator 103 without significant added loss. This condition may be met when, for example, beam separator 103 is positioned approximately coincident with a focal plane of lens 105, and mirror 108 is positioned approximately coincident with a focal plane of lens 107.

FIG. 3B depicts example components of a second implementation of beam combiner 24 of FIG. 1. As shown in FIG. 3B, locking arm 104 may use a patterned thin-film filter 111 in reflection as an aperture. In this case, either a dot or a vertical stripe on a face of patterned thin-film filter 111 (e.g., a center of a face that is perpendicular to a plane of the face of patterned thin-film filter 111) may be coated to be highly reflective, while the remainder of the face of patterned thin-film filter 111 may be highly transmissive. Here, a size of the reflective dot or the stripe may be chosen to suppress crosstalk. As further shown, locking arm 104 may include concave mirror 110 (e.g., in place of lens 107 and mirror 108 as described above with regard to FIG. 3A). In some implementations, beam combiner 24 of FIG. 3B may be simpler and/or more compact since, for example, beam combiner 24 of FIG. 3B includes fewer components and/or differently positioned components (e.g., as compared to beam combiner 24 of FIG. 3A).

FIG. 3C depicts example components of a third implementation of beam combiner 24 of FIG. 1. As shown in FIG. 3C, patterned thin-film filter 111 may be used in normal-incidence reflection. Here, as with beam combiner 24 of FIG. 3B, patterned thin-film filter 111 may include a dot or a stripe that is coated to be highly reflective, while elsewhere patterned thin-film filter 111 may be highly transmissive. However, beam combiner 24 may not include collimating lens 107 and mirror 108 or concave mirror 110, as shown above by FIGS. 3A and 3B, respectively. As such, beam combiner 24 of FIG. 3C may be simpler, more compact, and/or more efficient (e.g., as compared to beam combiners 24 of FIGS. 3A and 3B). Beam combiner 24 of FIG. 3C may have a different optical behavior as compared to beam combiners 24 of FIGS. 3A and 3B. For example, since the feedback signal of beam combiner 24 of FIG. 3C may be imaging with respect to the source elements of source array 100, the system may be self-aligning and therefore mechanically robust, while no crosstalk may be possible. In the example beam combiner 24 of FIG. 3C, the function of patterned thin-film filter 111 is to select a correct wavelength for each source element of source array 100 (e.g., rather than to block crosstalk as with beam combiners 24 of FIGS. 3A and 3B).

As further shown in FIG. 3C, in some implementations, beam combiner 24 may optionally include etalon 120 in order to narrow a linewidth and improve concentricity of overlapping output beams. For example, with a wavelength spacing of 1.7 nanometers (nm), a linewidth without etalon 120 may be approximately 0.5 nm, which may generate a blurring (i.e., ellipticity of a beam spot) of approximately 15% on output beam 109 (e.g., 0.5×(0.5 nm/1.7 nm)≈15%). However, for the same wavelength spacing, a linewidth with etalon 120 may be approximately 0.15 nm, which may generate a blurring of only approximately 4.5% on output beam 109 (e.g., 0.5×(0.15 nm/1.7 nm≈4.5%). In some implementations, etalon 120 may improve circularity of each beam spot (e.g., each wavelength channel). As shown in the above example, an ellipse may be formed out of the beams when beam combiner 24 does not include etalon 120, and a near circle may be formed out of the beams when beam combiner 24 includes etalon 120. In some implementations, etalon 120 may be positioned in locking arm 104 in order to reduce a power loss caused by etalon 120.

In some implementations, source array 100 may be a variable pitch source array. Use of a variable pitch source array may improve mutual alignment of beam spots when an etalon 120 is used. Here, since a wavelength grid defined by the etalon 120 may be slightly different than that defined by the combination of a uniformly pitched source array 100, lens 101, and diffraction grating 102, the output beams being imperfectly aligned such that the total output beam spot is blurred. For example, beam spots may be spread out laterally (e.g., up to approximately 50% of a circle diameter) when source array 100 is a uniformly pitched source array. However, if successive elements of source array 100 are chirped by a few microns (e.g., 10 to 30 microns, 15 to 25 microns, up to 40 microns, etc.) relative to each other (i.e., when source array 100 is a variable pitch source array), the beam spots may lie on top of one another. In other words, use of a variable pitch source array may correct for wavelength mismatch introduced by etalon 120 (and/or wavelength mismatch introduced by another component of beam combiner 24, such as diffraction grating 102, that is aggravated by etalon 120) due to the source elements operating at different wavelengths. In one example case, with eighteen 200-micron-diameter elements on a 260 micron pitch, approximately 20 microns of variation in pitch may be needed (e.g., such that the pitch varies from 250 to 270 microns).

In the example implementations described herein, beam combiner 24 may be configured such that a portion of a beam used for wavelength-locking may be a center of the beam (e.g., as shown in FIGS. 3A-3C), which may cause elements of source array 100 to lock on their corresponding lower-order modes, which may lead to improved beam quality.

Implementations, described herein, may also reduce a blurring effect. For example, as described above, the elements of source array 100 may lase with a linewidth that corresponds to a resolution of diffraction grating 102, which may cause substantial spatial blurring of the beam in the wavelength-combining direction (i.e., degrading quality of output beam 109). Here, etalon 120 may be inserted in locking arm 104 in order to narrow the linewidth, which may reduce or prevent the blurring effect. Etalon 120 may cause loss, but because the loss is incurred only on locking arm 104, such loss may not significantly affect output power or efficiency of beam combiner 24. Etalon 120 may be utilized in the embodiment shown in FIG. 3C, and may be positioned in a collimated beam between beam separator 103 and lens 105. However, positioning etalon 120 at another position within locking arm 104 and/or beam combiner 24 is also possible. Notably, etalon 120 may reduce the linewidth of each channel, reducing the blurring generated therefrom by the diffraction grating 102. However, positioning etalon 120 before beam separator 103 may result in loss to output beam 109 since etalon 120 loss would affect the entire beam (e.g., before separation into output beam 109 and locking beam 112 at beam separator 103).

Further, implementations, as described herein, may include using variable spacing for source elements in source array 100 in order to help ensure that resonant wavelengths of a combination of source array 100, lens 101, and diffraction grating 102 are aligned with those of etalon 120.

Notably, while FIGS. 3A-3C describe three example implementations, the configurations of the example implementations may be interchanged, combined, altered, or the like, in some implementations.

The number and arrangement of components shown in FIGS. 3A-3C are provided as an example. In practice, beam combiner 24 may include additional components, fewer components, different components, or differently arranged components than those shown in FIGS. 3A-3C. Additionally, or alternatively, a set of components (e.g., one or more components) of beam combiner 24 may perform one or more functions described as being performed by another set of components of beam combiner 24.

Implementations described herein may provide a beam combiner capable of reducing or preventing crosstalk by spatially separating a combined beam (e.g., exiting a grating) into a locking beam that is spatially filtered and fed back for wavelength locking without crosstalk, and an output beam that is used for output.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A beam combiner, comprising:
   an array of source elements,
      each source element, of the array of source elements, being configured to output a beam of light locked at a center wavelength different from center wavelengths of other source elements of the array of source elements;
   a dispersive element configured to combine the beams of light into a combined beam;
   a beam separator configured to separate the combined beam into an output beam and a locking beam,
      the locking beam comprising a smaller portion of the combined beam than the output beam,
         the smaller portion including a portion of the beam of light of each source element;
   a spatial filter configured to prevent crosstalk within the locking beam, and to redirect the locking beam back to the array of source elements; and
   the dispersive element configured to disperse the locking beam into constituent wavelength beams,
      each constituent wavelength beam being directed to a respective one of the array of source elements for locking that source element at its center wavelength, and
      each constituent wavelength beam corresponding in wavelength to the center wavelength of the respective source element.

2. The beam combiner of claim 1, wherein the spatial filter comprises a reflective or transmissive filter configured to reflect or transmit, respectively, the locking beam, while transmitting or reflecting, respectively, stray light.

3. The beam combiner of claim 2, wherein the spatial filter comprises:
   a substrate with an aperture for transmitting the locking beam, while reflecting or absorbing the stray light; and
   a mirror for reflecting the locking beam back through the aperture, the beam separator, the dispersive element, and to the array of source elements.

4. The beam combiner of claim 3, wherein the spatial filter further comprises:
   a first lens having a first focal plane substantially coincident with the beam separator, and a second focal plane substantially coincident with the aperture; and
   a second lens having a third focal plane substantially coincident with the aperture, and a fourth focal plane substantially coincident with the mirror.

5. The beam combiner of claim 2, wherein the spatial filter comprises:
   a substrate with an aperture for reflecting the locking beam, while transmitting the stray light; and
   a mirror for reflecting the locking beam back through the aperture, the beam separator, the dispersive element, and to the array of source elements.

6. The beam combiner of claim 5, wherein the spatial filter further comprises:
   a first lens having a first focal plane substantially coincident with the beam separator, and a second focal plane substantially coincident with the aperture; and
   wherein the mirror comprises a concave minor having a third focal plane substantially coincident with the aperture.

7. The beam combiner of claim 2, wherein the spatial filter comprises:
   a substrate with an aperture for reflecting the locking beam to the beam separator, while transmitting the stray light.

8. The beam combiner of claim 7, where the spatial filter further comprises:
   a first lens having a first focal plane substantially coincident with the beam separator, and a second focal plane substantially coincident with the aperture.

9. The beam combiner of claim 1, wherein the spatial filter comprises an etalon.

10. The beam combiner of claim 1, wherein the array of source elements has a variable pitch.

11. A beam combiner, comprising:
   a beam separator configured to separate a combined beam into an output beam and a locking beam, the combined beam being a beam of light that is a combination of beams of light provided by source elements of a source array, each source element, of the source array, being configured to output a beam of light locked at a center wavelength different from center wavelengths of other source elements of the source array, and the locking beam including a portion of the combined beam that is smaller than the output beam, the smaller portion including a portion of the beam of light of each source element;

a locking arm configured to prevent crosstalk within the locking beam, and to redirect the locking beam back to the source array; and a dispersive element configured to disperse the locking beam into a group of wavelength beams, each wavelength beam being directed to a respective one of the source elements, of the source array, for locking that source element at its center wavelength, and each wavelength beam corresponding in wavelength to the center wavelength of the respective source element.

12. The beam combiner of claim 11, wherein the locking arm comprises:

a spatial filter that includes a substrate with an aperture for transmitting the locking beam, while reflecting or absorbing stray light; and a mirror for reflecting the locking beam back through the aperture, the beam separator, the dispersive element, and to the source array.

13. The beam combiner of claim 12, wherein the spatial filter further comprises:

a first lens having a first focal plane approximately coincident with the beam separator, and a second focal plane approximately coincident with the aperture; and a second lens having a third focal plane approximately coincident with the aperture, and a fourth focal plane approximately coincident with the minor.

14. The beam combiner of claim 11, wherein the locking arm comprises:

a spatial filter including a substrate with an aperture for reflecting the locking beam, while transmitting stray light; and a mirror for reflecting the locking beam back through the aperture, the beam separator, the dispersive element, and to the source array.

15. The beam combiner of claim 14, wherein the spatial filter further comprises:

a first lens having a first focal plane approximately coincident with the beam separator, and a second focal plane approximately coincident with the aperture; and wherein the mirror comprises a concave minor having a third focal plane.

16. The beam combiner of claim 11, wherein the locking arm comprises a substrate with an aperture for reflecting the locking beam to the beam separator, while transmitting the stray light.

17. The beam combiner of claim 16, where the locking arm further comprises a first lens having a first focal plane approximately coincident with the beam separator, and a second focal plane approximately coincident with the aperture.

18. A method, comprising:

separating, by a beam combiner, a combined beam into an output beam and a locking beam, the combined beam being a beam of light that is a combination of beams of light provided by source elements included in a source array, each source element, of the source array, being configured to output a beam of light locked at a center wavelength different from center wavelengths of other source elements of the source array, and the locking beam including a portion of the combined beam that is smaller than the output beam, the smaller portion including a portion of the beam of light of each source element;

preventing, by the beam combiner, crosstalk within the locking beam;

redirecting, by the beam combiner, the locking beam back to the source array; and dispersing, by the beam combiner, the locking beam into a set of wavelength beams, each wavelength beam being directed to a respective one of the source elements of the source array for locking that source element at its center wavelength, and each wavelength beam corresponding in wavelength to the center wavelength of the respective source element.

19. The method of claim 18, further comprising:

transmitting the locking beam while reflecting or absorbing stray light; and reflecting the locking beam for dispersion into the set of wavelength beams.

20. The method of claim 18, further comprising:

reflecting the locking beam while transmitting stray light; and reflecting the locking beam for dispersion into the set of wavelength beams.

* * * * *